United States Patent [19]
Shimomura et al.

[11] Patent Number: 6,127,890
[45] Date of Patent: Oct. 3, 2000

[54] VARIABLE GAIN CIRCUIT WITH IMPROVED GAIN RESPONSE

[75] Inventors: Katsuya Shimomura; Shinji Saito, both of Kasugai, Japan

[73] Assignee: Fujitsu Limited, Kawasaki, Japan

[21] Appl. No.: 09/262,915

[22] Filed: Mar. 5, 1999

[30] Foreign Application Priority Data

Jul. 14, 1998 [JP] Japan ................................. 10-198816

[51] Int. Cl.⁷ ....................................................... H03F 3/45
[52] U.S. Cl. ........................................... 330/254; 330/134
[58] Field of Search ................................... 330/133, 134, 330/254, 279; 455/241.1, 251.1

[56] References Cited

U.S. PATENT DOCUMENTS

| | | | |
|---|---|---|---|
| 4,396,891 | 8/1983 | Johansson et al. ....................... | 330/254 |
| 4,489,282 | 12/1984 | Jett, Jr. ..................................... | 330/261 |
| 4,816,772 | 3/1989 | Klotz ......................................... | 330/254 |
| 5,732,342 | 3/1998 | Roth et al. ............................ | 455/234.1 |
| 5,940,143 | 8/1999 | Igarashi et al. ......................... | 348/678 |

FOREIGN PATENT DOCUMENTS 9-270649  10/1997  Japan .

*Primary Examiner*—Robert Pascal
*Assistant Examiner*—Henry Choe
*Attorney, Agent, or Firm*—Armstrong, Westerman, Hattori, McLeland & Naughton

[57] ABSTRACT

A variable gain circuit amplifies an input signal with a gain which depends on a control voltage. The gain circuit has a first amplifier with a gain that is proportional to the control voltage in a relatively low region of the control voltage and a second amplifier with a gain that is proportional to the control voltage in a relatively high region of the control voltage. The second amplifier also includes a gain circuit which maintains the gain of the second amplifier constant in a relatively low range of the control voltage. The second amplifier is connected to the first amplifier via a pair of coupling capacitors. The variable gain circuit may be used in a transmitter of a CDMA telephone.

20 Claims, 9 Drawing Sheets

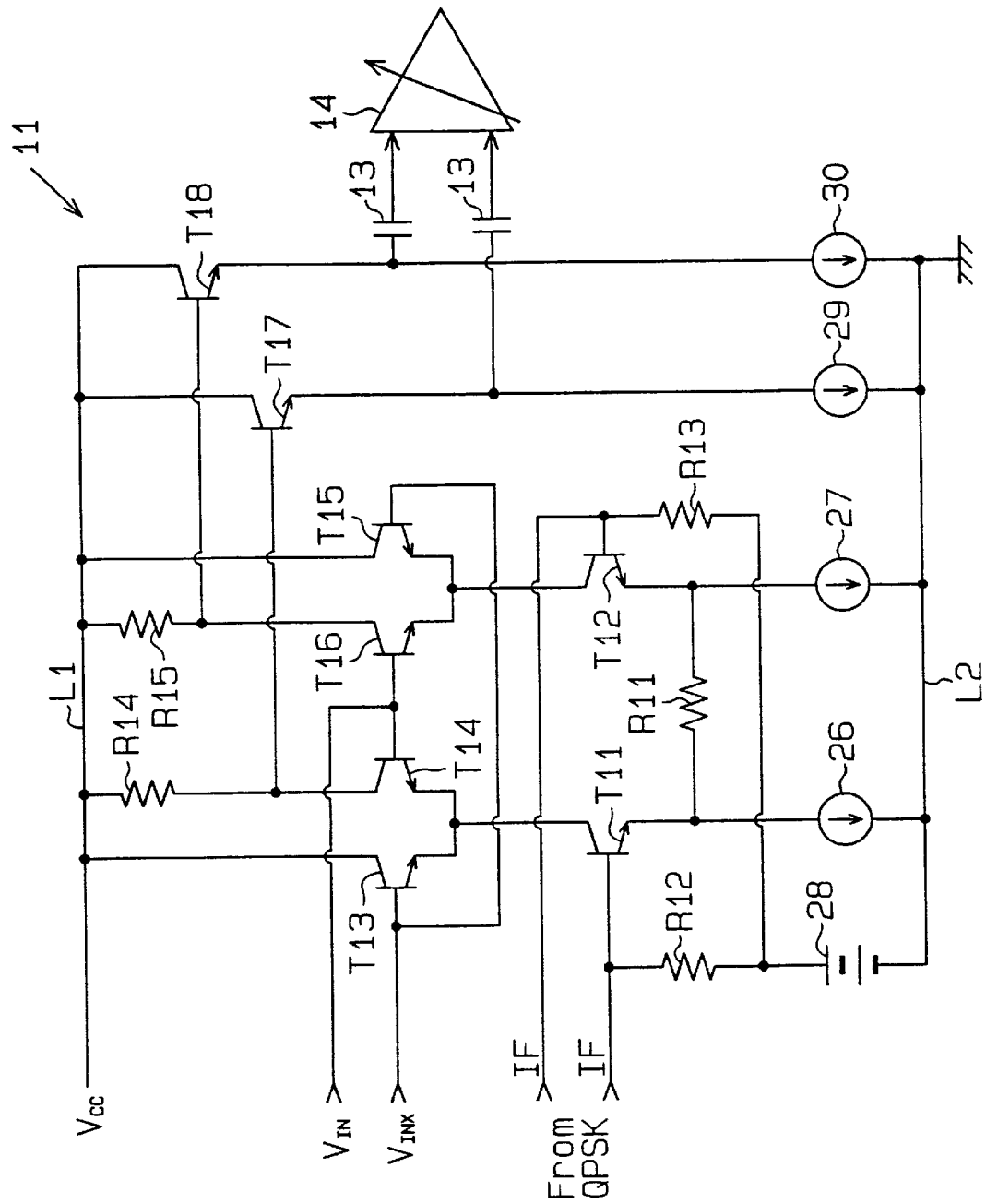

VARIABLE GAIN CIRCUIT WITH IMPROVED GAIN RESPONSE

BACKGROUND OF THE INVENTION

The invention relates to a variable gain circuit, and more particularly, to a variable gain circuit preferred for use in a code division multiple access (CDMA) system portable telephone.

Recently, portable telephones have become very popular. A CDMA portable telephone employs a variable gain circuit as disclosed in Japanese Unexamined Patent Publication No. 9-270,649, for example.

FIG. 1 shows an example of a variable gain circuit 70 in a transmitter of the portable telephone. The variable gain circuit 70 comprises a quadrature phase shift keying (QPSK) circuit 80, a first variable gain amplifier 81 of variable drive current type, a second variable gain amplifier 83 of constant drive current type, and an up-converter 82 connected between the amplifiers 81, 83.

The QPSK circuit 80 receives I and Q signals and modulates them on an intermediate frequency (IF) transmitting signal, which is then provided to the first variable gain amplifier 81, which in turn amplifies the IF transmitting signal to feed the up-converter 82.

The up-converter 82 mixes the amplified IF signal with a local oscillator frequency to convert the amplified IF signal into a high frequency signal or RF transmitting signal, which is then fed to the second variable gain amplifier 83, which in turn amplifies the RF transmitting signal. The amplified RF transmitting signal is passed via a bandpass filter, not shown, before being delivered to an antenna.

The first variable gain amplifier 81 comprises a differential amplifier 81a and a constant current circuit 81b formed by a transistor Q3. The differential amplifier 81a comprises a pair of transistors Q1 and Q2 having their emitters connected together. Each of the transistors Q1, Q2 has a base for receiving the IF transmitting signal. The transistor Q3 has a base for receiving an AGC voltage $V_{AGC}$, and the transistor Q3 controls a current I1 in accordance with the level of the voltage $V_{AGC}$. The differential amplifier 81a has a gain Ga which varies with a change in the current I1 in a manner graphically shown in FIG. 2(a).

The second variable gain amplifier 83 comprises a differential amplifier 83a, a constant current circuit 83b, and first and second current mirror circuits 83c, 83d. The differential amplifier 83a includes pairs of gain changing transistors Q11, Q12 and Q13, Q14 with the emitters of each pair connected together, and amplifying transistors Q15, Q16. The first current mirror circuit 83c includes a transistor Q19 in combination with the transistors Q11, Q14. The second current mirror circuit 83d includes a pair of transistors Q17, Q20 having their bases connected together and connected to the collector of the transistor Q20. A transistor Q18 is connected to the collector of the transistor Q20.

Each of the transistors Q15, Q16 has a base for receiving the RF transmitting signal, and the transistor Q18 has a base for receiving the voltage $V_{AGC}$. Thus, a collector current of the transistor Q18 is controlled in accordance with the level of the voltage $V_{AGC}$. A collector current of each of the transistors Q11, Q14 is proportional to the collector current of the transistors Q18. In other words, the collector current of each of the transistors Q11, Q14 is controlled in accordance with the level of the voltage $V_{AGC}$, whereby a gain Gb of the differential amplifier 83a varies in a manner graphically shown in FIG. 2(b).

As may be seen from FIG. 2(a), a response of the first variable gain amplifier 81 exhibits excellent linearity toward a higher gain, but is distorted toward a lower gain. This represents a problem which is common to variable gain amplifiers of variable drive current type. On the other hand, as may be seen from FIG. 2(b), a response of the second variable gain amplifier 83 exhibits an excellent linearity toward a lower gain, but is distorted toward a higher gain. This represents another problem which is common to variable gain amplifiers of constant drive current type.

Because the variable gain circuit 70 includes both the first and second variable gain amplifiers 81, 83, a total gain response G contains distortions toward both a lower and a higher gain, as graphically shown in FIG. 2(c), thus degrading the linearity of the total gain of the variable gain circuit 70.

It is an object of the present invention to provide a variable gain circuit having a highly linear gain response.

SUMMARY OF THE INVENTION

Independent Claims

Other aspects and advantages of the invention will become apparent from the following description, taken in conjunction with the accompanying drawings, illustrating by way of example the principles of the invention.

BRIEF DESCRIPTION OF DRAWINGS

The invention, together with objects and advantages thereof, may best be understood by reference to the following description of the presently preferred embodiments together with the accompanying drawings in which:

FIG. 6 is a circuit diagram of a first amplifier in the variable gain circuit of FIG. 3;

DETAILED DESCRIPTION OF THE PREFERRED EMBODIMENTS

Referring to FIGS. 3 to 8, a variable gain circuit 100 according to a first embodiment of the present invention suitable for use in a transmitter of a CDMA type portable telephone will be described. The variable gain circuit 100 may also be used in a receiver of the portable telephone.

Figure 3:
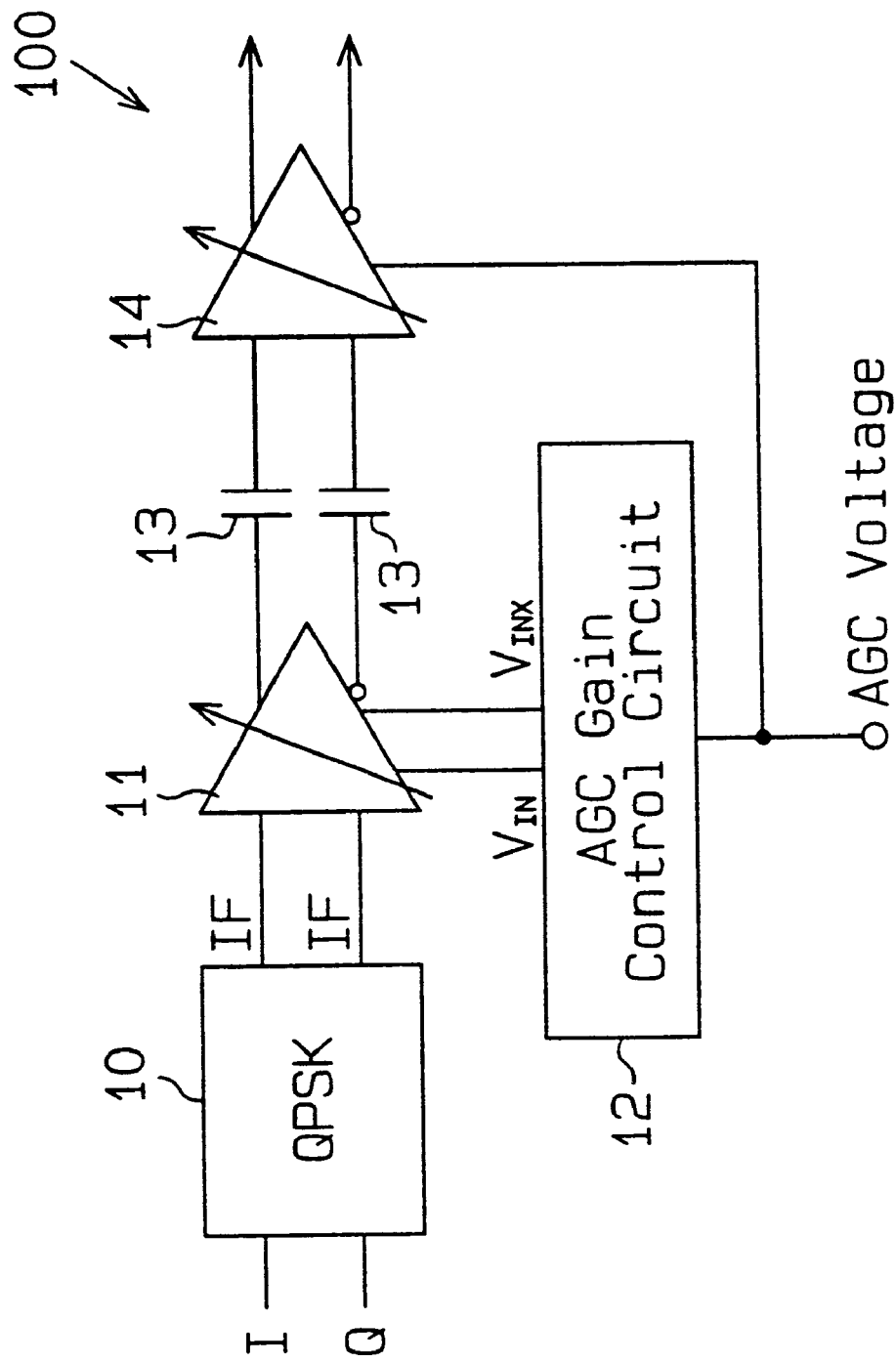
FIG. 3 is a schematic block diagram of a variable gain circuit according to a first embodiment of the present invention.

Referring to FIG. 3, the variable gain circuit 100 comprises a quadrature phase shift keying (QPSK) circuit 10, a first amplifier 11 connected to the QPSK circuit 10, a second amplifier 14 coupled to the first amplifier 11 via coupling capacitors 13, and an AGC circuit 12 connected to the first and second amplifiers 11, 14.

The QPSK circuit 10 receives a transmitting signal in the form of an I signal and a Q signal and generates IF transmitting signals by modulating the I signal and the Q signal, respectively. The AGC circuit 12 applies a first and a second control voltage $V_{IN}$, $V_{INX}$, which depend on the level of the AGC voltage $V_{AGC}$, to the first amplifier 11.

The first amplifier 11 is a variable gain amplifier, preferably a constant drive current type. The first amplifier 11 receives the IF transmitting signal from the QPSK circuit 10 and amplifies the IF transmitting signal in accordance with a potential difference between the first and second control voltages $V_{IN}$, $V_{INX}$.

The second amplifier 14 is a variable gain amplifier, preferably a variable drive current type and receives the amplified IF transmitting signal from the first amplifier 11 via the coupling capacitors 13, and effects a further amplification of the amplified If transmitting signal before feeding it to an up-converter, not shown. Note that both the first and second amplifiers 11, 14 preferably output an amplified signal and its inverse.

Figure 4:
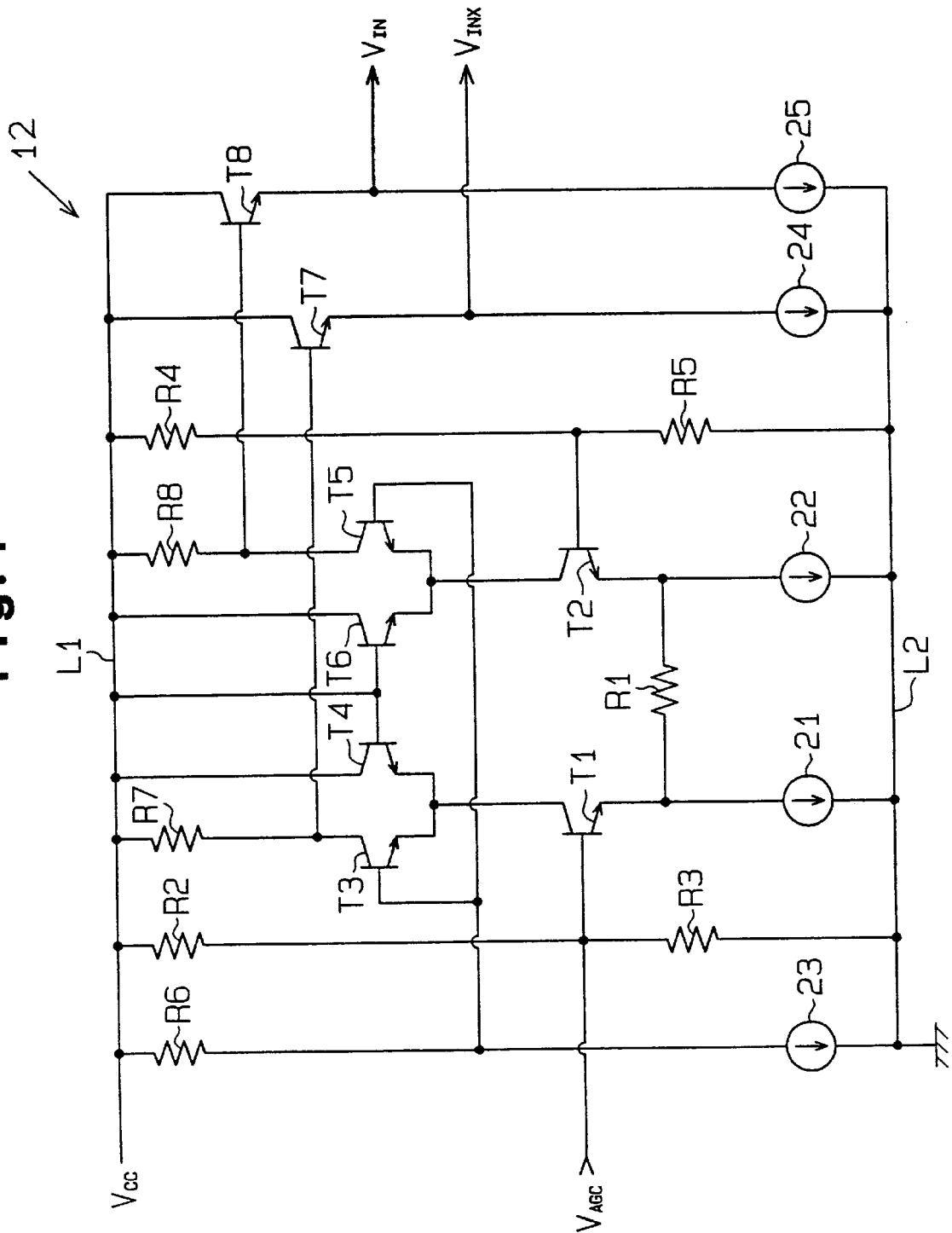
FIG. 4 is a circuit diagram of an AGC circuit of the variable gain circuit of FIG. 3.
Figure 5A:
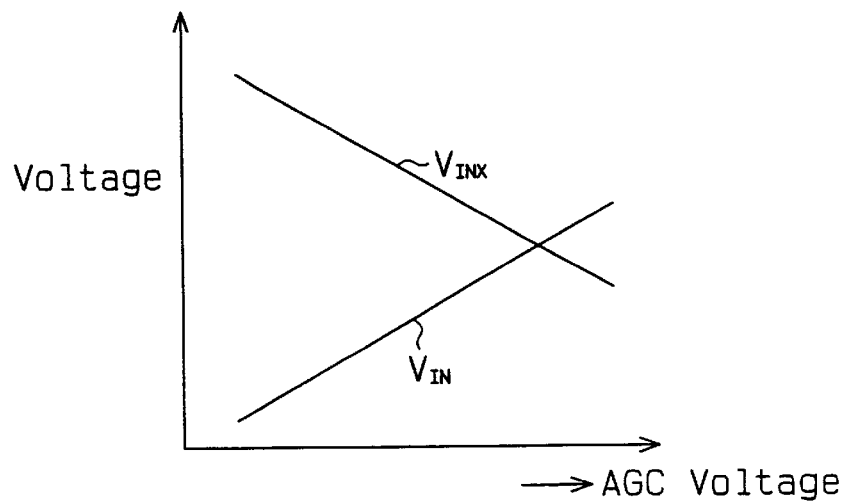
FIG. 5(a) is a graph showing the responses of a first and a second control voltage obtained by the AGC circuit of FIG. 4.
Figure 5B:
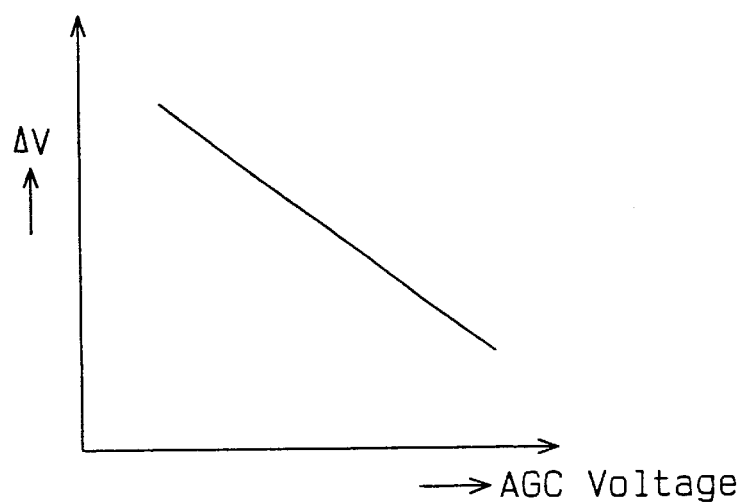
FIG. 5(b) is a graph showing a differential voltage obtained from the AGC circuit of FIG. 4.

The AGC circuit will be described initially with reference to FIGS. 4 and 5. Referring to FIG. 4, the AGC circuit 12 includes a bus L1 for providing a supply voltage Vcc and another bus L2 connected to the ground.

Amplifying transistors T1, T2 have emitters which are connected together via a resistor R1. The transistor T1 has a base for receiving an AGC voltage $V_{AGC}$ and a collector connected to the emitters of transistors T3, T4. The transistor T2 has a collector connected to the emitters of transistors T5, T6. The emitters of the transistors T1, T2 are connected to the bus L2 via respective constant current circuits 21, 22. The base of the transistor T1 is connected to a node between two voltage divider resistors R2, R3 which are connected in series between the buses L1, L2. A base of the transistor T2 is connected to a node between two resistors R4, R5 which are connected in series between the buses L1, L2.

The transistors T4, T6 have their bases connected together and connected to the bus L1, and have their collectors connected to the bus L1. The transistors T3, T5 have their bases connected together and their collectors connected to the bus L1 via resistors R7, R8, respectively. The bases of the transistors T3, T5 are connected to a node between a resistor R6 and a constant current circuit 23 which are connected in series across the buses L1, L2. The collector of the transistor T3 is connected to a base of an output transistor T7, and the collector of the transistor T5 is connected to a base of an output transistor T8.

The transistor T7 has a collector connected to the bus L1, and an emitter connected to the bus L2 via a constant current circuit 24. An emitter voltage from the transistor T7 is fed to the first amplifier 11 as the second control voltage $V_{INX}$. The transistor T8 has a collector connected to the bus L1 and an emitter connected to the bus L2 via a constant current circuit 25. An emitter voltage from the transistor T8 is fed to the first amplifier 11 as the first control voltage $V_{IN}$.

The AGC circuit 12 operates to produce the first control voltage $V_{IN}$ having a level which is proportional to the level of the AGC voltage $V_{AGC}$, and the second control voltage $V_{INX}$ having a level which is inversely proportional to the level of the AGC voltage $V_{AGC}$. The behaviors of the first and second control voltages $V_{IN}$, $V_{INX}$ are graphically shown in FIG. 5(a). Specifically, with an increase in the voltage $V_{AGC}$, the first control voltage $V_{IN}$ increases and the second control voltage $V_{INX}$ decreases. More specifically, with an increase in the voltage $V_{AGC}$, a collector current of the transistor T1 increases and a collector current of the transistor T2 decreases. As the collector current of the transistor T1 increases, a base current of transistor T7 decreases, thus decreasing the second control voltage $V_{INX}$. On the other hand, as the collector current of the transistor T2 decreases, a base current of the transistor T8 increases, thus increasing the first control voltage $V_{IN}$.

In contrast, with a decrease in the voltage $V_{AGC}$, the collector current of the transistor T1 decreases and the collector current of the transistor T2 increases. As the collector current of the transistor T1 decreases, the base current of the transistor T7 increases, thus increasing the second control voltage $V_{INX}$. On the other hand, as the collector current of the transistor T2 increases, the base current of the transistor T1 decreases, thus decreasing the first control voltage $V_{IN}$.

Figure 8A:
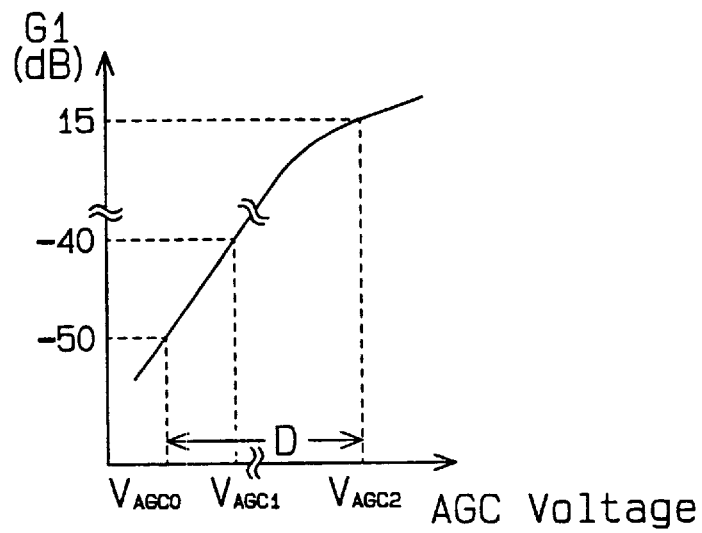
FIG. 8(a) is a graph showing a gain response of the first amplifier of FIG. 6.
Figure 8B:
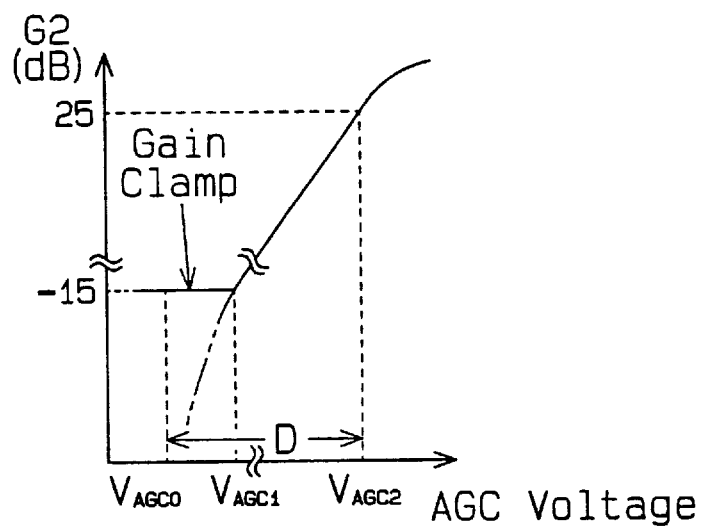
FIG. 8(b) is a graph showing a gain response of the second amplifier of FIG. 7.
Figure 8C:
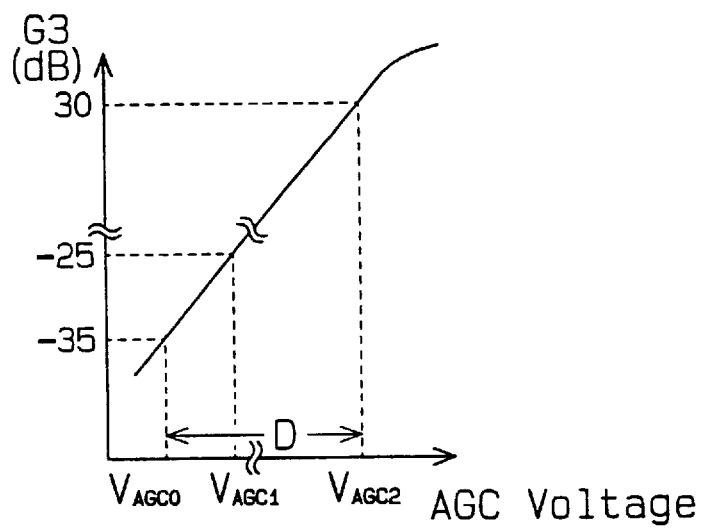
FIG. 8(c) is a graph showing a gain response of the variable gain circuit of FIG. 3.

The level of the $V_{AGC}$ is preferably chosen to be within a predetermined range D (see FIGS. 8(a) to 8(c)), extending from a minimum value $V_{AGC0}$ to a maximum value $V_{AGC2}$. In the range D of the voltage $V_{AGC}$, a potential difference $\Delta V(V_{IN}-V_{INX})$ between the first control voltage $V_{IN}$ and the second control voltage $V_{INX}$ changes in a manner graphically shown in FIG. 5(b). The potential difference $\Delta V$ decreases with an increase in the voltage $V_{AGC}$.

Referring now to FIG. 6, the first amplifier 11 will be described. As shown, amplifying transistors T11, T12 have emitters which are connected together via a resistor R11 and bases which receive the IF transmitting signal from the QPSK circuit 10. The emitters of the transistors T11, T12 are connected to the bus L2 via constant current circuits 26, 27, respectively. The bases of the transistors T11, T12 are connected to the positive terminal of a bias source 28 via resistors R12, R13, respectively. The negative terminal of the bias source 28 is connected to the bus L2.

The transistor T11 has a collector connected to the emitters of two gain changing transistors T13, T14. The transistor T12 has a collector connected to the emitters of two gain changing transistors T15, T16. Each of the transistors T13, TIS has a collector connected to the bus L1 and a base which connected together and to which the second control voltage $V_{INX}$ is applied.

The transistors T14, T16 have collectors which are connected to the bus L1 via resistors R14, R15, respectively, and bases which are connected together. The first control voltage $V_{IN}$ is applied to the base of each of transistors T14, T16, and the collectors of the transistors T14, T16 are connected to transistors T17, T18, respectively.

The transistor T17 has a collector connected to the bus L1, and an emitter connected to the bus L2 via a constant current circuit 29. The transistor T18 has a collector connected to the bus L1 and an emitter connected to the bus L2 via a constant current circuit 30. The emitters of the transistors T17, T18 are connected to the second amplifier 14 via the coupling capacitors 13.

In operation, the transistors T11, T12 amplify the IF transmitting signal from the QPSK circuit 10 in a differential manner, and the amplified IF transmitting signal is fed via the coupling capacitors 13 to the second amplifier 14. At this time, a gain G1 of the first amplifier 11 is controlled in accordance with the potential difference $\Delta V(V_{IN}-V_{INX})$ between the first and second control voltages $V_{IN}$, $V_{INX}$. In the range D of the voltage $V_{AGC}$, the gain G1 increases with a decrease in the potential difference $\Delta V$. In other words, the gain G1 of the first amplifier 11 increases with an increase in the voltage $V_{AGC}$, as shown in FIG. 8(a). Since the first amplifier 11 is a constant drive current type variable gain amplifier, the linearity of the gain response G1 is better toward a lower gain than toward a higher gain.

Figure 7:
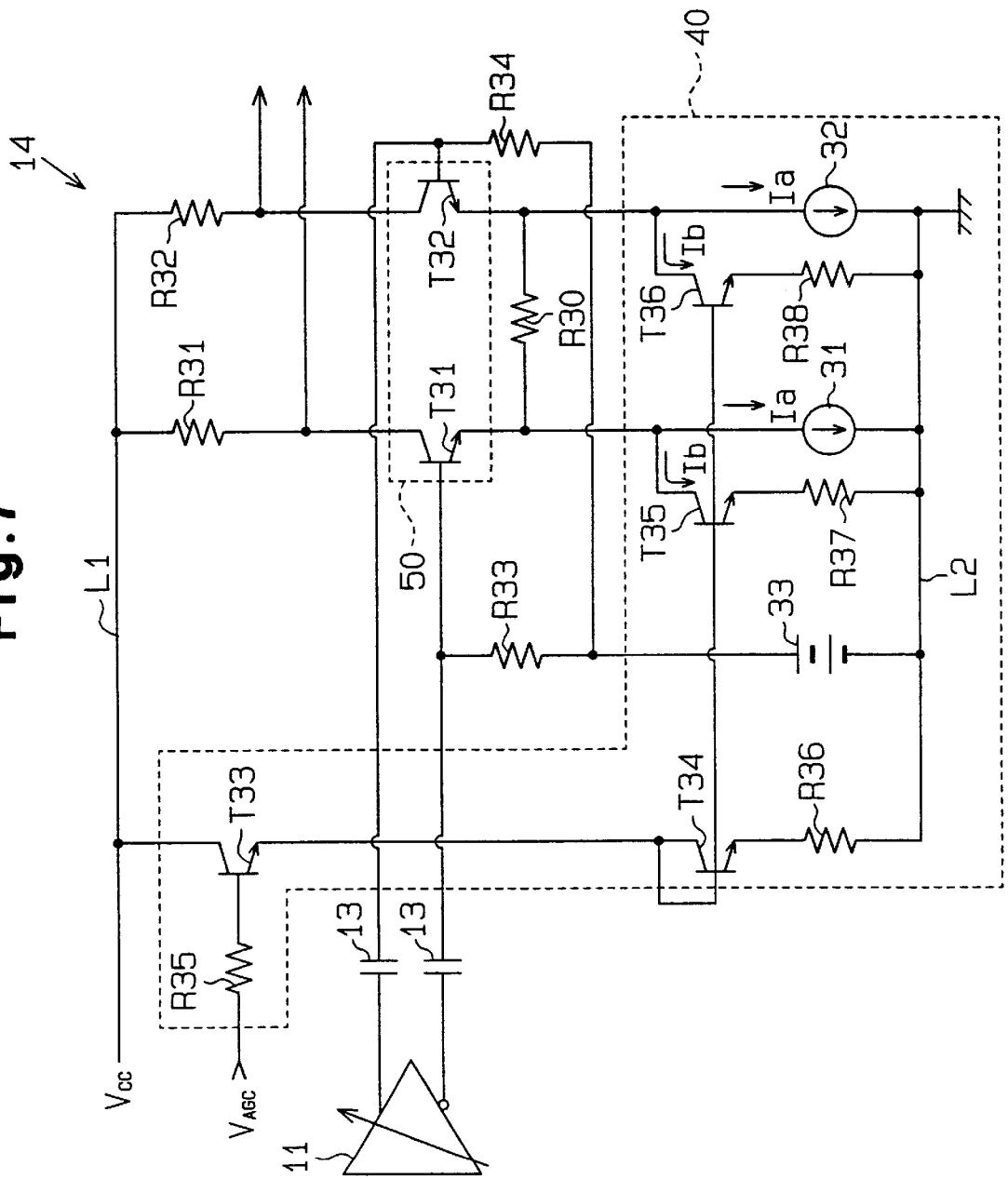
FIG. 7 is a circuit diagram of a second amplifier in the variable gain circuit of FIG. 3.

Referring now to FIG. 7, the second amplifier 14, which includes a gain clamp circuit 40 which improves the linearity of the gain response will be described. As shown, a differential amplifier 50 is formed by a pair of amplifying transistors T31, T32 which have their emitters connected together via a resistor R30, and bases which are connected to the coupling capacitors 13. In addition, each of the transistors T31, T32 has a collector connected to the bus L1 via respective resistors R31, R32. The emitters of the transistors T31, T32 are connected to the bus L2 via constant current circuits 31, 32, respectively. The bases of the transistors T31, T32 are also connected to a positive terminal of a bias source 33 via resistors R33, R34, respectively. A negative terminal of the bias source 33 is connected to the bus L2. The transistors T31, T32 receive the IF transmitting signal which is amplified by the first amplifier 11 at their bases and amplify the IF signal in a differential manner. The amplified IF signal is delivered from the collectors of the transistors T31, T32.

The gain clamp circuit 40 includes four transistors T33 to T36 and four resistors R35 to R38. A transistor T33 has a base which receives the voltage $V_{AGC}$ via a resistor R35, a collector connected to the bus L1 and an emitter connected to a collector of a transistor T34.

The transistor T34 has a base connected to its own collector and to the emitter of the transistor T33 and an emitter connected to the bus L2 via a resistor R36. A transistor T35 has a base connected to the collector and the base of the transistor T34, an emitter connected to the bus L2 via a resistor R37, and a collector connected to the emitter of the transistor T31.

A transistor T36 has a base connected to the base of the transistor T35, a collector connected to the emitter of the transistor T32, and an emitter connected to the bus L2 via a resistor R38. The base of the transistor T36 is connected via the transistor T35 to the base and the collector of the transistor T34.

When the voltage $V_{AGC}$ increases from the minimum voltage $V_{AGC0}$ in the range D as shown in FIG. 8(b), the collector current of the transistor T33 increases. As the collector current increases, the base current of each of the transistors T35 and T36 also increases. However, if the base current increases, the transistors T35, T36 are not turned on immediately because the base current is suppressed by the resistors R36, R37 and R38. As a consequence, the emitter currents of the transistors T31, T32 are maintained constant by the constant current circuits 31, 32.

As the level of the voltage $V_{AGC}$ increases to $V_{AGC1}$ or higher, the transistors T35, T36 are both turned on. As the voltage $V_{AGC}$ increases to the maximum value $V_{AGC2}$, the on resistance presented by the transistors T35, T36 decreases, thus increasing the emitter currents of the transistors T31, T32.

The described operation of the gain clamp circuit 40 allows the second amplifier 14 to operate as a variable drive current type variable gain amplifier. The second amplifier 14 exhibits a gain response G2 as graphically shown in FIG. 8(b). When the voltage $V_{AGC}$ is in a range from $V_{AGC0}$ to $V_{AGC1}$, the transistors T35, T36 both remain off, and the gain G2 of the second amplifier 14 is maintained constant.

When the voltage $V_{AGC}$ is in a range from $V_{AGC1}$ to $V_{AGC2}$, both of the transistors T35, T36 are turned on and have an on resistance which continues to decrease. Accordingly, the emitter currents of the transistors T31, T32 increase, and the gain response G2 of the second amplifier 14 becomes linear.

More specifically, as a current Ib begins to flow via each of the transistors T35, T36, the current flow via the transistors T31, T32 can be expressed as 2(Ia+Ib) where a current Ia passing via the constant current circuits 31, 32 is assumed to be constant.

The current Ib which passes via each of the transistors T35, T36 has a relationship with respect to the voltage $V_{AGC}$ and VT as represented by the equation (1) given below.

$$\text{Ib} \exp(V_{AGC}/VT)$$

$$VT = kT/q \tag{1}$$

where k represents Boltzmann's constant, q unit charge of electron and T absolute temperature.

Accordingly, the current Ib increases as an exponential function of the voltage $V_{AGC}$, and a gain G2 is related to the current Ib by the equation (2) indicated below.

$$G2\ 20\ \log(\text{Ib}) \tag{2}$$

According to the equation (2), the gain G2 of the second amplifier 14 is linear with respect to the voltage $V_{AGC}$. When the voltage $V_{AGC}$ is low enough to prevent a flow of the current Ib (in a range from $V_{AGC0}$ to $V_{AGC1}$), the current passing via the differential amplifier 50 is equal to 2(Ia), and thus the gain G2 remains constant.

The second amplifier 14 amplifies the IF transmitting signal with the gain G2 which is controlled by the voltage $V_{AGC}$, and the amplified IF transmitting signal is delivered from the emitters of the transistors T31, T32.

The operation of the variable gain circuit 100 (FIG. 3) will now be described. The first amplifier 11 receives the IF transmitting signal from the QPSK circuit 10, and amplifies the signal to feed the second amplifier 14, which in turn further amplifies the IF transmitting signal. The first amplifier 11 amplifies the IF transmitting signal with the gain G1 which depends on the potential difference $\Delta V$ between the first and second control voltages $V_{IN}$, $V_{INX}$, and the second amplifier 14 further amplifies the IF transmitting signal with the gain G2 which is controlled in accordance with the voltage $V_{AGC}$.

Specifically, in the range D of the voltage $V_{AGC}$, the gain response G1 of the first amplifier 11 exhibits excellent linearity toward a lower gain, as shown in FIG. 8(a). In the range D of the voltage $V_{AGC}$, the gain G2 of the second amplifier 14 exhibits excellent linearity toward a higher gain ($V_{AGC1}$ to $V_{AGC2}$) and remains constant toward a lower gain ($V_{AGC0}$ to $V_{AGC1}$), as shown in FIG. 8(b).

The total gain G3 of the variable gain circuit 100 is a synthesis of the gain response G1 of the first amplifier 11 and the gain response G2 of the second amplifier 14, as graphically shown in FIG. 8(c). The synthesized total gain response G3 exhibits excellent linearity over the entire range D of the voltage $V_{AGC}$. Accordingly, a signal which is transmitted from a transmitter of portable telephone having the variable gain circuit 100 can be received by a receiver with high accuracy.

Figure 9:
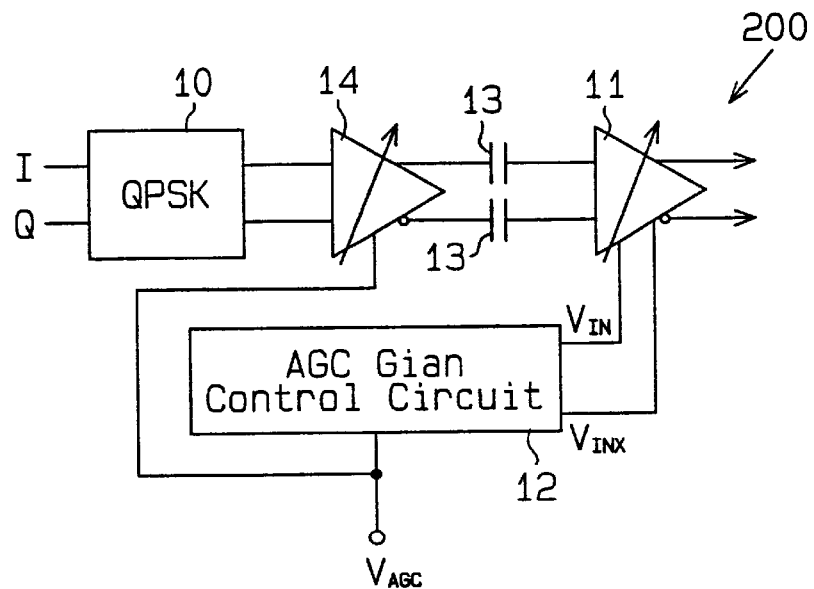
FIG. 9 is a schematic block diagram of a variable gain circuit according to a second embodiment of the present invention.
Figure 10:
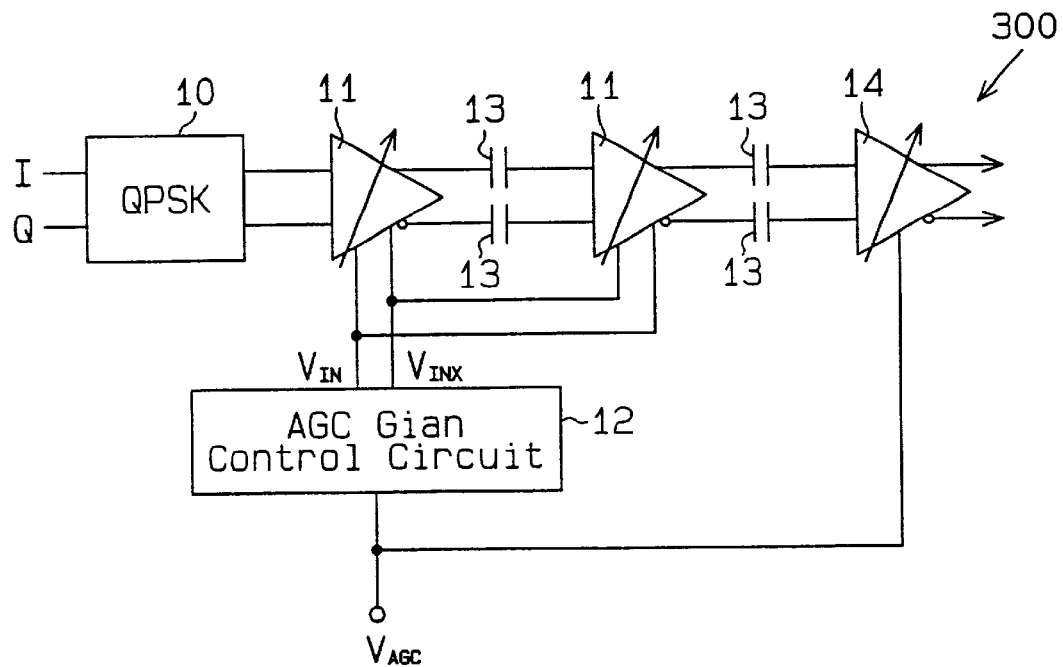
FIG. 10 is a schematic block diagram of a variable gain circuit according to a third embodiment of the present invention.

It should be apparent to those skilled in the art that the present invention may be embodied in many other specific forms without departing from the spirit or scope of the invention. Particularly, it should be understood that the invention may be embodied in the following forms:

The first and second amplifiers 11, 14 may be interchanged, as shown in FIG. 9. The number of the first and second amplifiers 11, 14 may be changed as desired. By way of example, FIG. 10 illustrates that a pair of first amplifiers 11 are connected in cascade via capacitors 13 and then followed by a second amplifier 14 via capacitors 13.

Figure 1:
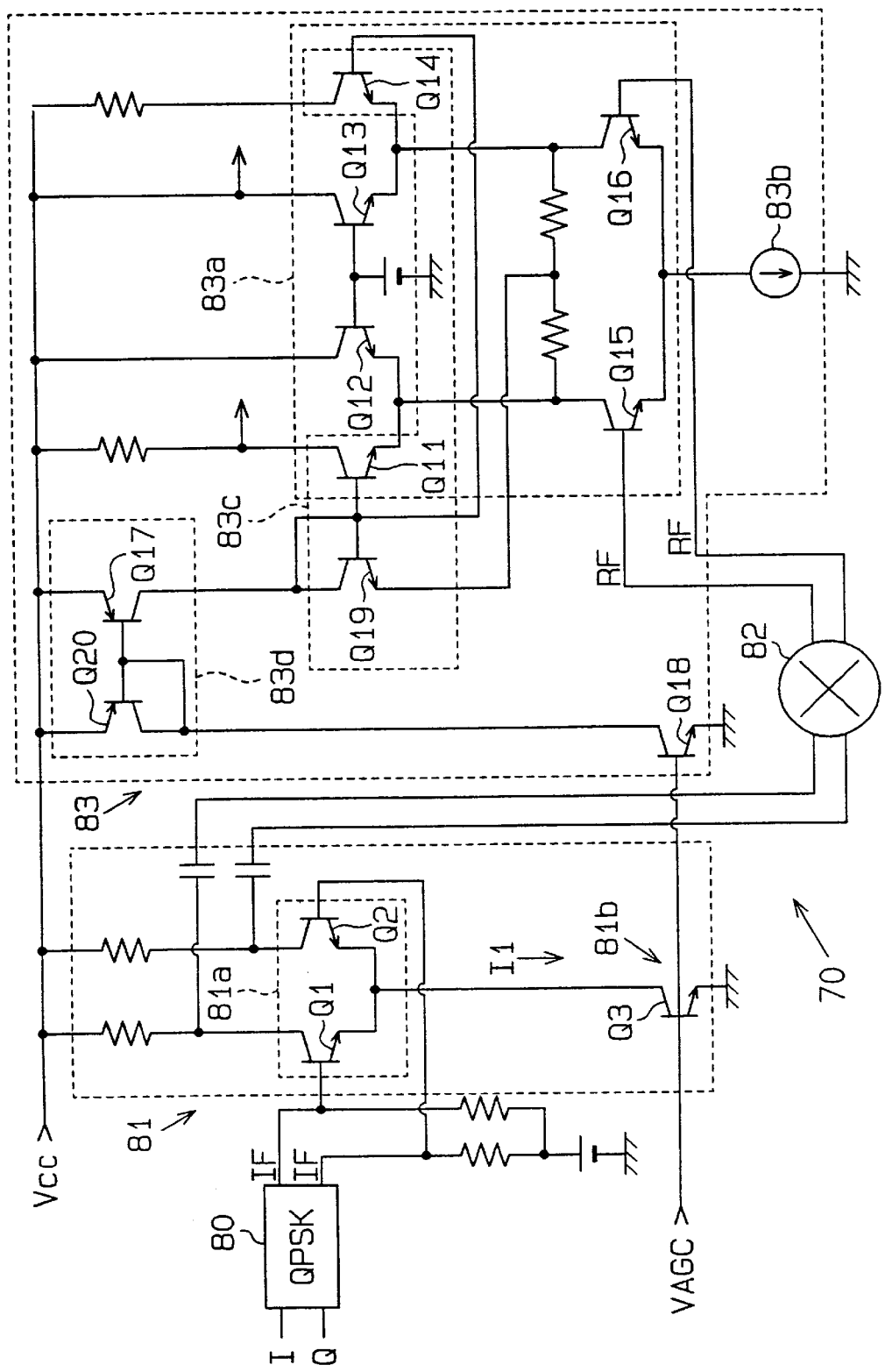
FIG. 1 is a circuit diagram of a conventional variable gain circuit.
Figure 2A:
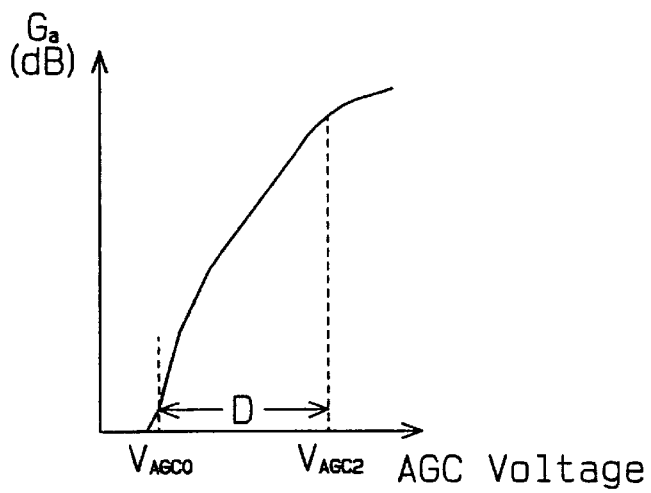
FIG. 2(a) is a graph showing a gain response of a first variable gain amplifier in the variable gain circuit of FIG. 1.
Figure 2B:
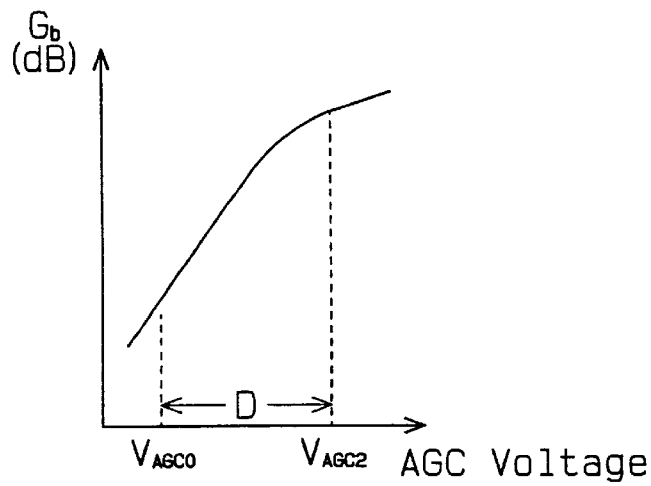
FIG. 2(b) is a graph showing a gain response of a second variable gain amplifier in the variable gain circuit of FIG. 1.
Figure 2C:
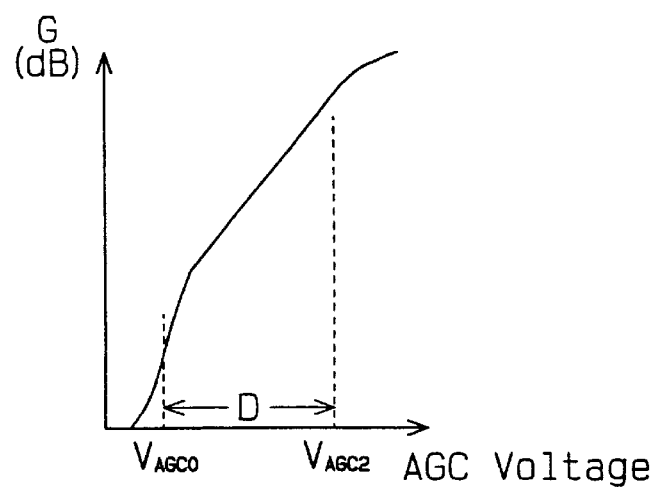
FIG. 2(c) is a graph showing a gain response of the variable gain circuit of FIG. 1.

As an alternative, in the variable gain circuit 100, the first and second amplifiers 11, 14 may be connected together via an up-converter (for a transmitter) or a down-converter (for a receiver), as in the conventional variable gain circuit 70 shown in FIG. 1, rather than being connected together via coupling capacitors 13.

In the described embodiments, a clamp circuit (not shown) which maintains a constant gain in a high frequency region may be included in the first amplifier 11.

Therefore, the present examples and embodiments are to be considered as illustrative and not restrictive and the invention is not to be limited to the details given herein, but may be modified within the scope and equivalence of the appended claims.

What is claimed is:

1. A variable gain circuit for amplifying an input signal with a gain which depends on a control voltage, the variable gain circuit comprising:

a first amplifier receiving an input signal and the control voltage and amplifying the input signal with a gain which depends on the control voltage to produce a first amplified signal, the gain of the first amplifier being substantially proportional to the control voltage in a relatively low region of the control voltage; and a second amplifier connected to the first amplifier and receiving the first amplified signal and the control voltage and amplifying the first amplified signal with a gain which depends on the control voltage, the gain of the second amplifier being substantially proportional to the control voltage in a relatively high region of the control voltage, the second amplifier including a gain clamp circuit which maintains the gain of the second amplifier constant in a relatively low region of the control voltage.

2. The variable gain circuit according to claim 1, wherein the first amplifier is a constant drive current type variable gain amplifier.

3. The variable gain circuit according to claim 2, further comprising a gain control circuit connected to the first amplifier for controlling the gain of the first amplifier.

4. The variable gain circuit according to claim 3, wherein the gain control circuit produces a first control signal having a level which is proportional to the level of the control voltage and a second control signal having a level which is inversely proportional to the level of the control voltage, the first amplifier receiving the first and second control signals and operating to amplify the input signal in accordance with a differential voltage between the first and second control signals.

5. The variable gain circuit according to claim 1, wherein the second amplifier is a variable drive current type variable gain amplifier.

6. The variable gain circuit according to claim 5, wherein the second amplifier includes a differential amplifier which receives the first amplified signal and differentially amplifies the first amplified signal, the gain clamp circuit includes a constant current circuit connected to the differential amplifier, and the differential amplifier maintains the current of the constant current circuit constant when the control voltage is less than a predetermined value and increases the current in a relative manner when the control voltage is equal to or greater than the predetermined value.

7. The variable gain circuit according to claim 5, wherein the second amplifier includes a differential amplifier which receives the first amplified signal and differentially amplifies the first amplified signal, the gain clamp circuit comprising a constant current circuit which passes a constant current via the differential amplifier, and a transistor which is turned on and off in accordance with the control voltage, the transistor having a collector connected to a node between one end of the constant current circuit and the differential amplifier, an emitter connected to the other end of the constant current circuit via a resistor, and a base which receives the control voltage.

8. The variable gain circuit according to claim 1, further comprising a quadrature phase shift keying circuit connected to the first amplifier, wherein the quadrature phase shift keying circuit receives an input signal and modulates it to generate the input signal received by the first amplifier.

9. A variable gain circuit for amplifying an input signal with a gain which depends on a control voltage, the variable gain circuit comprising:

a first amplifier receiving an input signal and the control voltage and amplifying the input signal with a gain which depends on the control voltage to produce a first amplified signal, the gain of the first amplifier being substantially proportional to the control voltage in a relatively high region of the control voltage; and a second amplifier connected to the first amplifier and receiving the first amplified signal and the control voltage and amplifying the first amplified signal with a gain which depends on the control voltage, the gain of the second amplifier being substantially proportional to the control voltage in a relatively low range of the control voltage, the first amplifier including a gain clamp circuit which maintains the gain of the first amplifier constant in a relatively low range of the control voltage.

10. The variable gain circuit according to claim 9, wherein the second amplifier is a constant drive current type variable gain amplifier.

11. The variable gain circuit according to claim 10, further comprising a gain control circuit connected to the second amplifier for controlling the gain of the second amplifier.

12. The variable gain circuit according to claim 10, further comprising a gain control circuit connected to the first amplifier for controlling the gain of the first amplifier, the gain control circuit producing a first control signal having a level which is proportional to the level of the control voltage and a second control signal having a level which is inversely proportional to the level of the control voltage, the first amplifier receiving the first and second control signals and operating to amplify the input signal in accordance with a differential voltage between the first and second control signals.

13. The variable gain circuit according to claim 9, wherein the first amplifier is a variable drive current type variable gain amplifier.

14. The variable gain circuit according to claim 13, wherein the first amplifier includes a differential amplifier which receives the first amplified signal and differentially amplifies the first amplified signal, the gain clamp circuit includes a constant current circuit connected to the differential amplifier and maintains the current of the constant current circuit constant when the control voltage is less than a predetermined value and increases the current in a relative manner when the control voltage is equal to or greater than the predetermined value.

15. The variable gain circuit according to claim 13, wherein the first amplifier includes a differential amplifier which receives the first amplified signal and differentially amplifies the first amplified signal, the gain clamp circuit includes a constant current circuit connected to the differential amplifier to pass a constant current therethrough, and a transistor which is turned on and off in accordance with the control voltage, the transistor having a collector connected to a node between one end of the constant current circuit and the differential amplifier, an emitter connected to the other end of the constant current circuit via a resistor, and a base which receives the control voltage.

16. The variable gain circuit according to claim 9, further comprising a quadrature phase shift keying circuit connected to the first amplifier, wherein the quadrature phase shift keying circuit receives an input signal and modulates the input signal to generate the input signal received by the first amplifier.

17. A variable gain circuit for amplifying an input signal with a gain which depends on a control voltage, the variable gain circuit comprising:

a first amplifier receiving the input signal and a control signal and amplifying the input signal with a gain which depends on the control voltage to provide a first amplified signal;

a second amplifier connected to the first amplifier and receiving the first amplified signal and the control voltage, and amplifying the first amplified signal with a gain which depends on the control voltage to provide a second amplified signal, wherein the gains of the first and second amplifiers are substantially proportional to the control voltage in a relatively low region of the control voltage; and a third amplifier connected to the second amplifier and receiving the second amplified signal and the control voltage, and amplifying the second amplified signal with a gain which depends on the level of the control voltage, the gain of the third amplifier being substantially proportional to the control voltage in a relatively high region of the control voltage, the third amplifier including a gain clamp circuit which maintains the gain of the third amplifier constant in a relatively low region of the control voltage.

18. The variable gain circuit according to claim 17 wherein the first and second amplifiers are constant drive current type variable gain amplifiers.

19. The variable gain circuit according to claim 18, further comprising a gain control circuit connected to the first and second amplifiers for controlling the gains of the first and second amplifiers.

20. The variable gain circuit according to claim 17, wherein the third amplifier is a variable drive current type variable gain amplifier.

* * * * *